United States Patent
Cheng et al.

(10) Patent No.: US 7,031,794 B2
(45) Date of Patent: Apr. 18, 2006

(54) SMART OVERLAY CONTROL

(75) Inventors: Kun-Pi Cheng, Bei chiu (TW); Hsin-Yuan Chen, Tainan (TW); Yo-Nien Lin, Tainan (TW); Feng-Cheng Chung, Taipei (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 53 days.

(21) Appl. No.: 10/672,394

(22) Filed: Sep. 26, 2003

(65) Prior Publication Data

US 2005/0071033 A1    Mar. 31, 2005

(51) Int. Cl.
*G06F 19/00* (2006.01)

(52) U.S. Cl. .................. 700/121; 700/95; 700/117; 716/19

(58) Field of Classification Search .................. 700/90, 700/95, 117, 121; 438/14; 716/19, 21
See application file for complete search history.

(56) References Cited

U.S. PATENT DOCUMENTS

| 4,958,160 | A | * | 9/1990 | Ito et al. ........................ 355/53 |
| 6,023,338 | A | | 2/2000 | Bareket ....................... 356/401 |
| 6,092,031 | A | * | 7/2000 | Yasuda ......................... 702/94 |
| 6,127,075 | A | | 10/2000 | Hsu ............................. 430/30 |
| 6,218,200 | B1 | | 4/2001 | Chen et al. ................... 438/14 |
| 6,338,971 | B1 | * | 1/2002 | Yasuda et al. ................ 438/14 |
| 6,405,096 | B1 | * | 6/2002 | Toprac et al. ............... 700/121 |
| 6,622,061 | B1 | * | 9/2003 | Toprac et al. ............... 700/121 |
| 6,826,743 | B1 | * | 11/2004 | Park et al. .................... 716/21 |
| 6,853,440 | B1 | * | 2/2005 | Van De Pasch et al. ...... 355/53 |

* cited by examiner

*Primary Examiner*—Jayprakash N. Gandhi

(57) ABSTRACT

An automatic method to maintain and correct overlay in the fabrication of integrated circuits is described. An overlay control table is automatically generated for lots run through a process tool. An overlay correction is calculated from the overlay control table and sent to the process tool for real-time or manual overlay correction.

19 Claims, 2 Drawing Sheets

SMART OVERLAY CONTROL

BACKGROUND OF THE INVENTION (1) Field of the Invention

The present invention relates to the fabrication of integrated circuit devices, and more particularly, to a system of automatic overlay correction in the fabrication of integrated circuit devices.

(2) Description of the Prior Art

Lithography is widely used in integrated circuit fabrication. A material layer is deposited on a wafer. A masking material is formed over the material layer and exposed in a particular pattern to form a mask for etching, for example. The material layer is then etched where it is not covered by the mask. Another material layer is deposited over the patterned first material layer and the process is repeated to pattern the second layer. This process is repeated many times in the fabrication of an integrated circuit device. It is important that the patterns are aligned properly between layers. Alignment marks are used to align each layer to the previous layer. For example, a "box-in-box" alignment mark in a scribe line may be used. The previous layer alignment mark box is larger than the current layer's box. The centers of each box are measured in both the x- and y-directions. The difference in the box centers is the translation error of one layer to the other.

Typically, the engineer will manually feed back the translation to the exposure tool, perhaps weekly or monthly for correction of the overlay; that is, how closely two layers are aligned. This manual process is not a real-time correction process. With this method, alignment performance is unstable. The exposure tool may drift at any time. Different layers may have different topology or the wafer may warp slightly due to prior annealing, and so on. Many factors may affect alignment. It is desired to apply overlay correction in a real-time manner.

U.S. Pat. No. 6,218,200 B1 to Chen et al shows a method of aligning multiple layers in an automatic overlay correction system. U.S. Pat. No. 6,127,075 to Hsu teaches a method for checking the accuracy of a measuring instrument used to measure overlay. U.S. Pat. No. 6,023,338 to Bareket discloses a novel alignment mark pattern and measuring method.

SUMMARY OF THE INVENTION

Accordingly, it is a primary object of the invention to provide an automatic method to maintain and correct overlay in the fabrication of integrated circuits.

It is a further object of the invention to automatically generate an overlay control table for real-time overlay control.

Another object is to automatically generate an overlay control table for manual overlay control.

In accordance with the objects of the invention, a smart overlay control system is achieved. The overlay control system comprises a plurality of process machines, a data collection tool which measures overlay error from a run of a lot through a process machine, an overlay tool servo which processes overlay error data, sends overlay error data to an operator for use in manual overlay correction, and sends overlay error data to a smart overlay control servo for use in automatic overlay correction, a smart overlay control servo which generates an overlay control table for each lot type, and an equipment servo which obtains previous layer correction and fine tuning values from the smart overlay control servo for a lot on a process machine, calculates an overlay correction using the previous layer correction and the fine tuning values, and sends the overlay correction to the process machine.

Also in accordance with the objects of the invention, an automatic method to maintain and correct overlay in the fabrication of integrated circuits is achieved. An overlay control table is automatically generated for lots run through a process tool. An overlay correction is calculated from the overlay control table and sent to the process tool for real-time or manual overlay correction.

BRIEF DESCRIPTION OF THE DRAWINGS

In the accompanying drawings forming a material part of this description, there is shown.

DESCRIPTION OF THE PREFERRED EMBODIMENTS

The process of the present invention provides a smart overlay control (SOC) system that provides real-time overlay feedback and correction. The system also provides a solution for a foundry fabrication mixing run. That is, lots of various types and needing various overlay corrections can be mixed together in this system.

Figure 1:
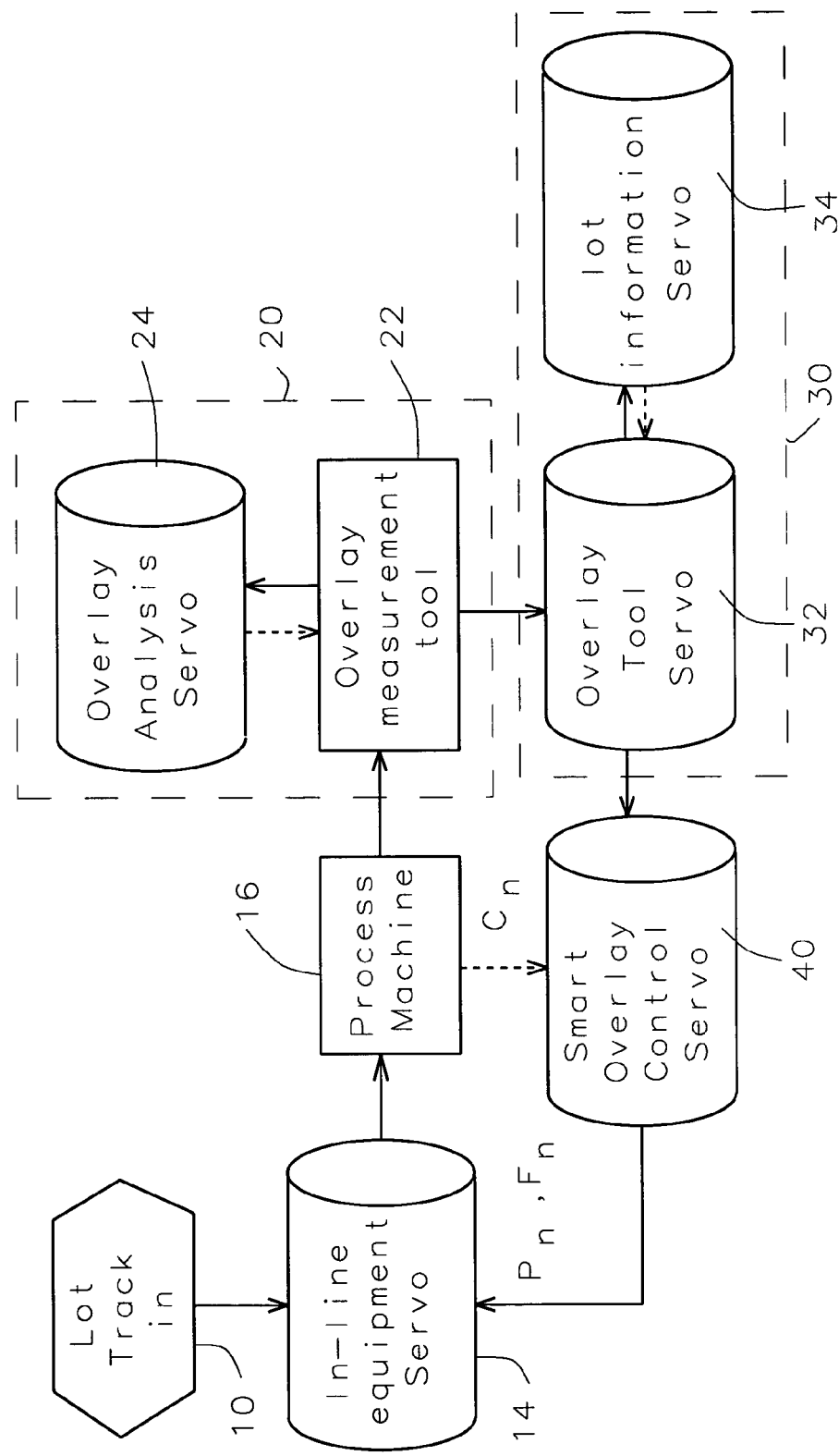
FIG. 1 illustrates a flow chart of the smart overlay control (SOC) system of the present invention.

FIG. 1 is a flow chart of the smart overlay control (SOC) system of the present invention. Lots of wafers to be processed enter the system at 10. The In-line Equipment Servo 14 determines the products' running condition; i.e. overlay correction, exposure energy, focus offset, etc. This Servo 14 provides input to the process machine 16 which is the exposure tool to be used in the lithography process.

Box 20 represents the data collection feature of the SOC system. The Overlay Measurement Tool 22 takes measurements of the alignment marks from layer to layer. The Overlay Analysis Servo 24 models raw data from the Overlay Measurement Tool 22. The output of the data collection box 20 goes to the data processing box 30.

Figure 2:
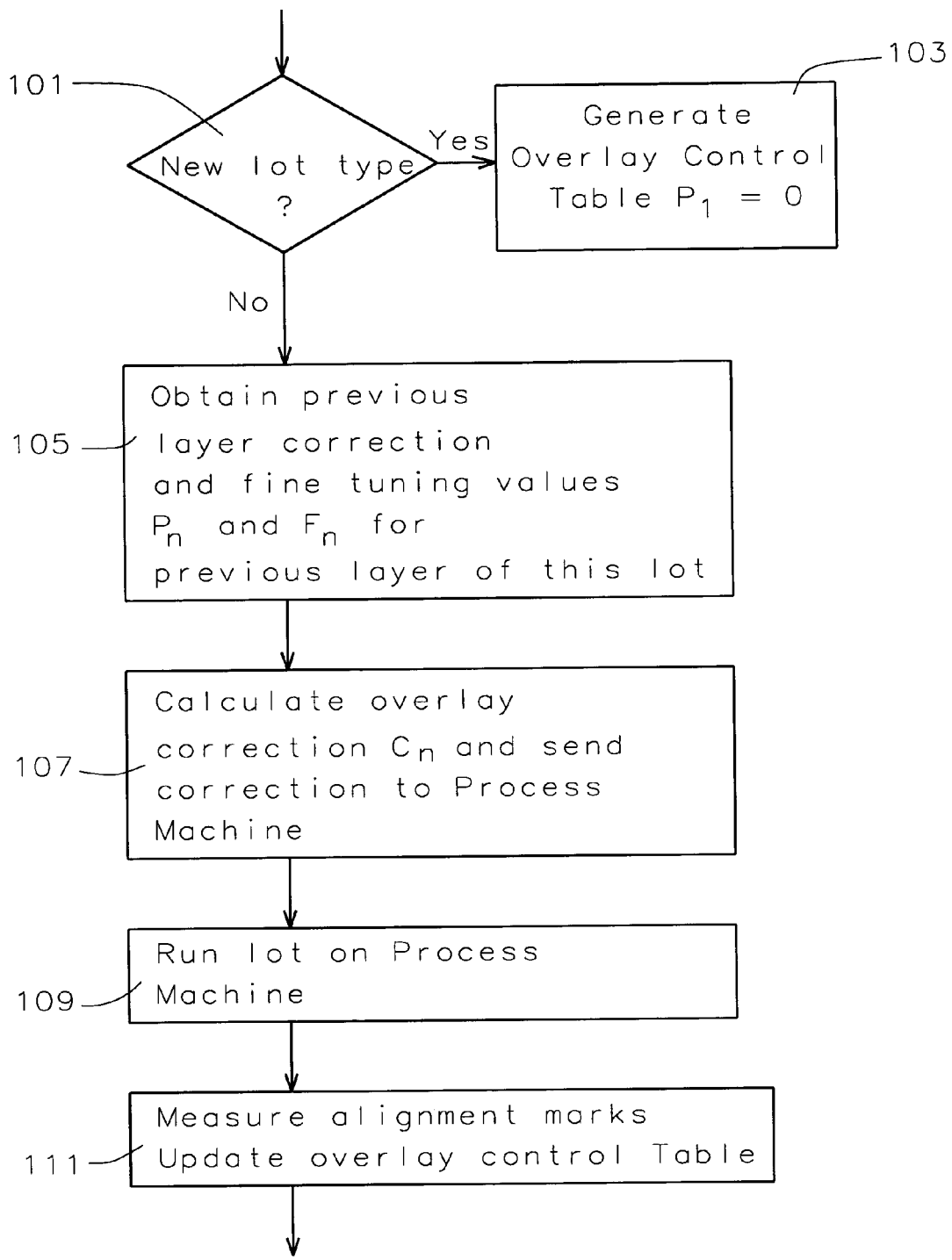
FIG. 2 illustrates a flow chart of a preferred method of using the SOC system of the present invention.

Referring to FIG. 2. the data processing box 30 includes an Overlay Tool Servo 32 and a Lot Information Servo 34. The Overlay Tool Servo 32 automatically generates an overlay control table. The overlay control table includes the relevant values $C_n$, $P_n$, $O_n$, $R_n$, $F_n$ and K for a lot n as defined in Table 1 provided below. Overlay Control Tables are generated for each lot type. Each overlay control table encompasses a given technology, layer, and exposure tool combination. The current layer overlay condition $C_n$ is calculated front the previous layer overlay correction plus fine tune adjustment.

The Smart Overlay Control Servo 40 automatically generates an overlay control table. Tables are generated for each lot type. Each table encompasses a given technology, layer, and exposure tool combination. The current layer overlay condition $C_n$ is calculated from the previous layer overlay correction plus fine tune adjustment.

Table 1 illustrates the Smart Overlay Control Tuning Algorithm.

TABLE 1

| Lot | Tool $C_n = P_n + F_{n-1}$ | Overlay $O_n$ | Residual Error $R_n$ | Fine Tune $F_n$ |
|---|---|---|---|---|
| n = 1 | $C_1 = P_1 + K$ | $O_1$ | $R_1 = K - O_1$ | $F_1 = R_1$ |
| n = 2 | $C_2 = P_2 + F_1$ | $O_2$ | $R_2 = F_1 - O_2$ | $F_2 = \frac{1}{2} * (R_1 + R_2)$ |
| n = 3 | $C_3 = P_3 + F_2$ | $O_3$ | $R_3 = F_2 - O_3$ | $F_3 = \frac{1}{3} * (R_1 + R_2 + R_3)$ |
| n = 4 | $C_4 = P_4 + F_3$ | $O_4$ | $R_4 = F_3 - O_4$ | $F_4 = \frac{1}{3} * (R_2 + R_3 + R_4)$ |
| n = 5 | $C_5 = P_5 + F_4$ | $O_5$ | $R_5 = F_4 - O_5$ | $F_5 = \frac{1}{3} * (R_3 + R_4 + R_5)$ |
| n = 6 | $C_6 = P_6 + F_5$ | $O_6$ | $R_6 = F_5 - O_6$ | $F_6 = \frac{1}{3} * (R_4 + R_5 + R_6)$ |
| n = k | $C_k = P_k + F_{k-1}$ | $O_k$ | $R_k = F_{k-1} - O_k$ | $F_k = \frac{1}{3} * (R_{k-2} + R_{k-1} + R_k)$ |
| n = k + 1 | $C_{k+1} = P_{k+1} + F_k$ | $O_{k+1}$ | $R_{k+1} = F_k - O_{k+1}$ | $F_{k+1} = \frac{1}{3} * (R_{k-1} + R_k + R_{k+1})$ | where $C_n$ is the current layer overlay correction $P_n$ is the previous layer overlay correction; $P_1=0$.

$O_n$ is the overlay measurement error $R_n$ is the residual overlay error $F_n$ is the SOC fine tune. Initially, this is the first residual error, then the average of the residuals of prior lots and the current lot. A running average of the residual errors of the last two lots plus the current lot is used.

K is the average process offset. This is supplied with the initial data for the first lot and may be zero.

The $P_n$ value come from the Lot Information Servo 34. For manual overlay correction, the Overlay Tool Servo 32 sends the overlay control table to the Lot Information Servo. For automatic overlay correction, the Overlay Tool Servo 32 sends the overly control table to the Smart Overlay Control Servo 40.

The In-Line Equipment Servo 14 queries the Smart Overlay Control Servo 40 for the previous layer correction and fine tuning values $P_n$ and $F_n$, respectively. The In-Line Equipment Servo calculates the correction $C_n$ from the $P_n$ sent to it and the previous $F_{n-1}$. The In-Line Equipment Servo 14 sends the overlay correction $C_n$ to the Process Machine 16. The overlay correction $C_n$ is then sent from the Process Machine 16 to the Smart Overlay Control Servo 40 to be used as the next layer's $P_n$ for that lot n.

The process of the present invention can be used with a single alignment mark system or wit a multiple alignment mark system. In the case of the multiple alignment mark system, the weight of Pn is set to zero; that is the previous layer overlay correction is not used. This is because in a multiple alignment mark system, the alignment mark is exposed and the layer patterned at the same time for some critical layers.

FIG. 2 is a flow chart illustrating the processing of a lot through a process machine using the Smart Overlay Control system of the present invention. If this is the first lot of its type to be run through the process machine 16 (in FIG. 1), an Overlay Control Table is generated for the lot (step 103) where P1 is set to 0. Now, in step 105, the previous layer correction and fine tuning values are obtained by the In-Line Equipment Servo 14 from the Smart Overlay Control Servo 40. The Overlay Control Servo 40 has obtained the Overlay Control Table from the Overlay Tool Servo 32. Now, in step 107, the In-Line Equipment Servo 14 calculates the overlay correction Cn and sends it to the Process Machine 16.

The lot is run on the Process Machine 16 (step 109). The data collection system 20 measures the alignment marks and sends the data to the Overlay Tool Servo 32 for updating the Overlay Control Table (step 111).

The Smart Overlay Control system of the present invention improves cycle time and decreases process engineers' loading. The SOC system has been implemented and has been shown to improve the mean plus 3 sigma overlay performance measurement by more than 25%. The rate of rework due to misalignment was found to be improved from more than about 0.5% by lot to less than 0.3% by lot.

While the invention has been particularly shown and described with reference to the preferred embodiments thereof, it will be understood by those skilled in the art that various changes in form and details may be made without departing from the spirit and scope of the invention.

What is claimed is:

1. An overlay control system comprising:

a plurality of process machines;

a data collection tool wherein said data collection tool measures overlay error from a run of a lot through a process machine and generates overlay error measurement data;

a data processing tool for processing said overlay error measurement data, said processing including generating an overlay control table wherein said overlay control table comprises current layer overlay correction value, $C_n$, previous layer overlay correction value, $P_n$, overlay measurement error value, $O_n$, residual overlay error value, $R_n$, fine tuning value, $F_n$, and average process offset value, K for a lot n, wherein the data processing tool sends the overlay control table to an operator for use in manual overlay correction or to a smart overlay control servo for use in automatic overlay correction; and an in-line equipment servo wherein said in-line equipment servo obtains previous layer correction and fine tuning values from said smart overlay control servo for a lot on a process machine, calculates an overlay correction using said previous layer overlay correction and said fine tuning values, and sends said overlay correction to said process machine, wherein for said lot n, the overlay control table is generated using the following algorithm:

| | $C_n = P_n + F_{n-1}$ | $O_n$ | $R_n$ |
|---|---|---|---|
| n = 1 | $C_1 = P_1 + K$ | $O_1$ | $R_1 = K - O_1$ |
| n = 2 | $C_2 = P_2 + F_1$ | $O_2$ | $R_2 = F_1 - O_2$ |
| n = 3 | $C_3 = P_3 + F_2$ | $O_3$ | $R_3 = F_2 - O_3$ |
| n = 4 | $C_4 = P_4 + F_3$ | $O_4$ | $R_4 = F_3 - O_4$ |
| n = 5 | $C_5 = P_5 + F_4$ | $O_5$ | $R_5 = F_4 - O_5$ |
| n = 6 | $C_6 = P_6 + F_5$ | $O_6$ | $R_6 = F_5 - O_6$ |
| n = k | $C_k = P_k + F_{k-1}$ | $O_k$ | $R_k = F_{k-1} - O_k$ |
| n = k + 1 | $C_{k+1} = P_{k+1} + F_k$ | $O_{k+1}$ | $R_{k+1} = F_k - O_{k+1}$ |

| | $F_n$ |
|---|---|
| n = 1 | $F_1 = R_1$ |
| n = 2 | $F_2 = \frac{1}{2} * (R_1 + R_2)$ |
| n = 3 | $F_3 = \frac{1}{3} * (R_1 + R_2 + R_3)$ |
| n = 4 | $F_4 = \frac{1}{3} * (R_2 + R_3 + R_4)$ |
| n = 5 | $F_5 = \frac{1}{3} * (R_3 + R_4 + R_5)$ |
| n = 6 | $F_6 = \frac{1}{3} * (R_4 + R_5 + R_6)$ |
| n = k | $F_k = \frac{1}{3} * (R_{k-2} + R_{k-1} + R_k)$ |
| n = k + 1 | $F_{k+1} = \frac{1}{3} * (R_{k-1} + R_k + R_{k+1})$ | wherein said variables $C_n$, $P_n$, $O_n$, $R_n$, $F_n$, and K are defined as above and $P_1=0$ and K value is supplied with initial data for n=1.

2. The system according to claim 1 wherein said overlay correction for a lot's current layer on said process tool is equal to an overlay correction for said lot's previous layer on said process tool plus fine tuning wherein said fine tuning is equal to a running average of previous lots' overlay errors.

3. The system according to claim 2 wherein said overlay control system is used with a multiple alignment mark system and wherein said overlay correction for said lot's previous layer on said process tool is set to zero.

4. The system according to claim 1 wherein said overlay control table encompasses a given technology, a particular layer, and a particular process tool combination.

5. The system according to claim 1 wherein said overlay control system is used with a single alignment mark system.

6. The overlay control system of claim 1, wherein said data processing tool comprises:
an overlay tool servo; and
a lot information servo, wherein said overlay tool servo generates the overlay control table.

7. The overlay control system of claim 1, wherein said process machines are exposure tools.

8. A method of overlay control comprising:
automatically generating an overlay control table for lots run through a process tool, wherein for a lot n, said overlay control table is generated using the following algorithm:

|  | $C_n = P_n + F_{n-1}$ | $O_n$ | $R_n$ |
|---|---|---|---|
| n = 1 | $C_1 = P_1 + K$ | $O_1$ | $R_1 = K - O_1$ |
| n = 2 | $C_2 = P_2 + F_1$ | $O_2$ | $R_2 = F_1 - O_2$ |
| n = 3 | $C_3 = P_3 + F_2$ | $O_3$ | $R_3 = F_2 - O_3$ |
| n = 4 | $C_4 = P_4 + F_3$ | $O_4$ | $R_4 = F_3 - O_4$ |
| n = 5 | $C_5 = P_5 + F_4$ | $O_5$ | $R_5 = F_4 - O_5$ |
| n = 6 | $C_6 = P_6 + F_5$ | $O_6$ | $R_6 = F_5 - O_6$ |
| n = k | $C_k = P_k + F_{k-1}$ | $O_k$ | $R_k = F_{k-1} - O_k$ |
| n = k + 1 | $C_{k+1} = P_{k+1} + F_k$ | $O_{k+1}$ | $R_{k+1} = F_k - O_{k+1}$ |

| | $F_n$ |
|---|---|
| n = 1 | $F_1 = R_1$ |
| n = 2 | $F_2 = \frac{1}{2} * (R_1 + R_2)$ |
| n = 3 | $F_3 = \frac{1}{3} * (R_1 + R_2 + R_3)$ |
| n = 4 | $F_4 = \frac{1}{3} * (R_2 + R_3 + R_4)$ |
| n = 5 | $F_5 = \frac{1}{3} * (R_3 + R_4 + R_5)$ |
| n = 6 | $F_6 = \frac{1}{3} * (R_4 + R_5 + R_6)$ |
| n = k | $F_k = \frac{1}{3} * (R_{k-2} + R_{k-1} + R_k)$ |
| n = k + 1 | $F_{k+1} = \frac{1}{3} * (R_{k-1} + R_k + R_{k+1})$ | wherein $C_n$ is current layer overlay correction value $P_n$ is previous layer overlay correction value where $P_1=0$, $O_n$ is overlay measurement error value, $R_n$ is residual overlay error value $F_n$ is fine tuning value, and K is average process offset value where K is supplied with initial data for n=1; and
sending an overlay correction calculated from said overlay control table to an in-line equipment servo for automatic overlay correction of said process tool in real-time.

9. The method according to claim 8 wherein said overlay correction for a lot's current layer on said process tool is equal to an overlay correction for said lot's previous layer on said process tool plus fine tuning wherein said fine tuning is equal to a running average of previous lots' overlay errors.

10. The method according to claim 9 wherein said overlay control is used with a multiple alignment mark system and wherein said overlay correction for said lot's previous layer on said process tool is set to zero.

11. The method according to claim 8 wherein said overlay control table encompasses a given technology, a particular layer, and a particular process tool combination.

12. The method according to claim 8 wherein said overlay control is used with a single alignment mark system.

13. The method of claim 8, wherein said process tool is an exposure tool.

14. A method of overlay control comprising:
automatically generating an overlay control table for lots run through a process tool, wherein for a lot n, said overlay control table is generated using the following algorithm:

|  | $C_n = P_n + F_{n-1}$ | $O_n$ | $R_n$ |
|---|---|---|---|
| n = 1 | $C_1 = P_1 + K$ | $O_1$ | $R_1 = K - O_1$ |
| n = 2 | $C_2 = P_2 + F_1$ | $O_2$ | $R_2 = F_1 - O_2$ |
| n = 3 | $C_3 = P_3 + F_2$ | $O_3$ | $R_3 = F_2 - O_3$ |
| n = 4 | $C_4 = P_4 + F_3$ | $O_4$ | $R_4 = F_3 - O_4$ |
| n = 5 | $C_5 = P_5 + F_4$ | $O_5$ | $R_5 = F_4 - O_5$ |
| n = 6 | $C_6 = P_6 + F_5$ | $O_6$ | $R_6 = F_5 - O_6$ |
| n = k | $C_k = P_k + F_{k-1}$ | $O_k$ | $R_k = F_{k-1} - O_k$ |
| n = k + 1 | $C_{k+1} = P_{k+1} + F_k$ | $O_{k+1}$ | $R_{k+1} = F_k - O_{k+1}$ |

| | $F_n$ |
|---|---|
| n = 1 | $F_1 = R_1$ |
| n = 2 | $F_2 = \frac{1}{2} * (R_1 + R_2)$ |
| n = 3 | $F_3 = \frac{1}{3} * (R_1 + R_2 + R_3)$ |
| n = 4 | $F_4 = \frac{1}{3} * (R_2 + R_3 + R_4)$ |
| n = 5 | $F_5 = \frac{1}{3} * (R_3 + R_4 + R_5)$ |
| n = 6 | $F_6 = \frac{1}{3} * (R_4 + R_5 + R_6)$ |
| n = k | $F_k = \frac{1}{3} * (R_{k-2} + R_{k-1} + R_k)$ |
| n = k + 1 | $F_{k+1} = \frac{1}{3} * (R_{k-1} + R_k + R_{k+1})$ | wherein $C_n$ is current layer overlay correction value, $P_n$ is previous layer overlay correction value where $P_1=0$, $O_n$ is overlay measurement error value, $R_n$ is residual overlay error value, $F_n$ is fine tuning value, and K is average process offset value where K is supplied with initial data for n=1; and
sending an overlay correction calculated from said overlay control table to a lot information servo for manual overlay correction of said process tool.

15. The method according to claim 14 wherein said overlay correction for a lot's current layer on said process tool is equal to an overlay correction for said lot's previous layer on said process tool plus fine tuning wherein said fine tuning is equal to a running average of previous lots' overlay errors.

16. The method according to claim 15 wherein said overlay control is used with a multiple alignment mark system and wherein said overlay correction for said lot's previous layer on said process tool is set to zero.

17. The method according to claim 14 wherein said overlay control table encompasses a given technology, a particular layer, and a particular process tool combination.

18. The method according to claim 14 wherein said overlay control is used with a single alignment mark system.

19. The method of claim 14, wherein said process tool is an exposure tool.

* * * * *